United States Patent [19]
Saito

[11] Patent Number: 5,786,615
[45] Date of Patent: Jul. 28, 1998

[54] JUNCTION FIELD-EFFECT TRANSISTOR (JFET) SEMICONDUCTOR INTEGRATED CIRCUIT DEVICE INCLUDING JFET

[75] Inventor: Yutaka Saito, Tokyo, Japan

[73] Assignee: Seiko Instruments Inc., Tokyo, Japan

[21] Appl. No.: 651,637

[22] Filed: May 22, 1996

Related U.S. Application Data

[63] Continuation of Ser. No. 204,461, Feb. 28, 1994, abandoned.

[30] Foreign Application Priority Data

| Mar. 1, 1993 | [JP] | Japan | 5-040319 |
| Jan. 21, 1994 | [JP] | Japan | 6-005479 |

[51] Int. Cl.$^6$ ............................................. H01L 27/01
[52] U.S. Cl. ................................. 257/348; 257/347
[58] Field of Search ............................. 257/285, 288, 257/270, 350, 347, 348, 353

[56] References Cited

U.S. PATENT DOCUMENTS

| 3,660,732 | 5/1972 | Allison | 257/347 |
| 4,237,473 | 12/1980 | Chiang | 257/258 |
| 4,816,880 | 3/1989 | Muro | 257/285 |
| 5,237,187 | 8/1993 | Sumanai et al. | 257/288 |
| 5,262,654 | 11/1993 | Yamazaki | 257/53 |
| 5,296,727 | 3/1994 | Kawai et al. | 257/270 |
| 5,343,064 | 8/1994 | Spangler et al. | 257/350 |

FOREIGN PATENT DOCUMENTS

| 166218 | 1/1986 | European Pat. Off. . |
| 462882 | 12/1991 | European Pat. Off. . |
| 4606969 | 7/1992 | Japan . |

OTHER PUBLICATIONS

Onoda et al., "Si–Gate CMOS Devices on a Si/CaF$_2$/Si Structure"; IEEE Trans. on Elect. Dexs., vol. ED–34, No. 11, Nov. 1987 pp. 2280–2285.

European Search Report, dated Aug. 16, 1995 for Appl. No. 94102914.2.

Eiji Fujii, et al., "A CPD Image Sensor with an SOI Structure", IEEE Transactions on Electron Devices, May 1988, vol. 35, No. 5, pp. 642–645.

Donald E. Booth, et al., "Dimensional Microcircuit Integration Techniques Using Wager Bonding", Extended Abstracts, vol. 1, May 16–21, 1993.

*Primary Examiner*—Jerome Jackson
*Assistant Examiner*—Nathan K. Kelley
*Attorney, Agent, or Firm*—Loeb & Loeb LLP

[57] ABSTRACT

A plurality of JFETs (junction field-effect transistors) can be formed on the same substrate while being electrically separated from each other, and can be also combined with a CMOS (complementary metal-oxide semiconductor). A P$^-$type Si layer 14 is fabricated on a semiconductor substrate 11 as an island. On this island of P$^-$type Si layer, an N$^+$ source region 19 and N$^+$ drain region, and a channel region having a length of "Lg" and a channel depth of "Tg" are fabricated. The shape of the gate region with the gate length of "Lg" is not a V-shaped-structure. Another P type layer 21 of the gate region is fabricated on the same plane as the source region 19 and the drain region 15.

4 Claims, 12 Drawing Sheets

JUNCTION FIELD-EFFECT TRANSISTOR (JFET) SEMICONDUCTOR INTEGRATED CIRCUIT DEVICE INCLUDING JFET

This is a continuation of application Ser. No. 08/204,461 filed on Feb. 28, 1994, now abandoned.

BACKGROUND OF THE INVENTION

The present invention relates to a junction field-effect transistor and a semiconductor integrated circuit device containing such a junction field-effect transistor.

DESCRIPTION OF THE PRIOR ART

In FIG. 16A, there is schematically shown a sectional view of a basic idea of an N-channel type junction field-effect transistor (simply abbreviated as an "N-channel JFET") known in the art. As illustrated in FIG. 16A, an N⁻type semiconductor substrate (N⁻type layer) 100 has two N⁺type impurity layers 101 located at opposite sides of the semiconductor substrate 100, one of which is a drain region and the other of which is a source region. This semiconductor substrate 100 further has an opposite conductivity type impurity region, i.e., P⁺type layer 103 functioning as a gate region. As shown in this drawing, the semiconductor device is so constructed that the channel current flowing through the drain-to-source path is controlled by varying the voltage applied between the gate electrode 104 and the source electrode 102 to change the depletion layer 108. In general, the semiconductor device has a pentode tube characteristic with the saturation region in case that the channel length "Lg" becomes longer than, or equal to approximately 2 micrometers, and a triode tube characteristic in case that the channel length becomes shorter than the approximately 2 micrometers. In any way, for instance, the drain current "Id"-to-gate voltage "Vg" characteristic indicates the normally ON type(state) semiconductor characteristic (also referred to a "depletion mode"), while the drain voltage "Vd" is constant, as shown in FIG. 16B. FIG. 16C represents a symbolic diagram of a general JFET. FIG. 17 schematically shows a sectional view of one example of the practical JFET having a V-shaped groove. In this practical JFET, an N⁻type layer 100 is fabricated by way of the epitaxial growth, the thickness of which is on the order of 1 micrometer. The, V-shaped groove 109 is formed by way of the anisotropic etching by KOH and the like, and both the channel length Lg and the channel thickness Tg are controlled within the required dimension of 1 micrometer.

FIG. 18 schematically shows a sectional view for explaining the reason why a multiple element cannot be readily manufactured on the same semiconductor substrate in the conventional JFET. In the previously explained V-shaped groove type JFET, a V-shaped groove 1814 deeper than the V-shaped groove 1807 used to form the channel region is formed in such a manner that this groove 1814 reaches a channel impurity region 1804 to be connected to the channel electrode. These V-shaped grooves 1814 are fabricated so as to separate a first JFET 1801, a second JFET 1806, and up to an N-th JFET 1810 from each other. In FIG. 18, reference numeral 1802 denotes a source electrode of the first JFET 1801, reference numeral 1803 indicates a drain electrode of the first JFET 1801; reference numeral 1809 shows a source electrode of the second JFET 1806; reference numeral 1811 represents a source electrode of the N-th JFET 1810; and reference numeral 1812 indicates a drain electrode of the N-th JFET 1810.

In accordance with great progress of recent semiconductor technology, various types of semiconductor devices have been changed from one type to another type, for instance, from a bipolar transistor into a MOS transistor; from a MOS device into a CMOS device; and from an IC into an LSI. Among them, although a JFET (junction field-effect transistor) has a high input impedance, this JFET owns such features of low noise/high speed response characteristics. Further, although the JFET is manufactured only as a discrete element, there are still great needs of utilization in the radioactivity measuring field.

The conventional JFETs own the above-described constructions, and also the below-mentioned problems.

As to a first problem, since the gate length and the gate thickness of the conventional JFET are first manufactured to have a thickness of approximately 1 micrometer by the V-shaped groove, there are many problems in the control characteristics of the manufacturing steps. That is, there is high fluctuation, and yield is low.

As to a second problem, since the channel region is fabricated on a single semiconductor substrate by the epitaxial growth, this JFET cannot be manufactured as an integrated circuit, resulting in a discrete semiconductor device. In other words, as apparent from FIG. 18, even when the respective JFETs would be separated from each other by way of the V-shaped grooves 1814, since the channel impurity region 1804 is commonly employed for the first to N-th JFETs 1801, 1806, 1810, these first to N-th JFETs would be electrically connected to each other, and therefore could not be independently operated as a single JFET.

SUMMARY OF THE INVENTION

The present invention has been made in an attempt to solve the above-described problems by employ the following solution means, and thus has an object to provide a junction type field-effect transistor, a semiconductor integrated circuit device including such junction type field-effect transistors, and a method for manufacturing them, capable of having an improved high frequency characteristic, a lower ON-resistance, and a high voltage-to-current amplification factor.

To achieve the above-described object of the present invention, the below-mentioned solution means are employed.

As a first solution means, an SOI substrate is employed as a semiconductor substrate used to fabricate a JFET. The SOI (silicon on insulator) substrate is such a semiconductor substrate that an insulating layer is fabricated on a first semiconductor substrate on which a thin-film semiconductor substrate is provided. A typical thickness of the thin film semiconductor substrate could be realized from several tens of angstroms to several tens of micrometers by way of the recent semiconductor manufacturing technology. Various semiconductor substrate methods have been proposed, for instance, the SIMOX method, ZMR method, laminating method, and so on. The SOI substrate manufactured by the laminating method is the most suitable for this thin-film semiconductor substrate due to its crystalline nature. In case that a plurality of elements are fabricated on the same substrate at the same time, such a means is employed that thin-film semiconductor substrates on which the respective elements are formed (will be referred to an "Si layer of SOI" hereinafter) are completely separated from each other by an SiO₂film, or the like which could reach the underlying insulating layer. It should be noted that such a separated semiconductor substrate will be referred as an "island" in the following description.

As a second solution method, the channel length "Lg" of the JFET is manufactured by the photolithography in a plane control manner instead of the above-explained V-shaped groove.

As a third solution method, an N⁻type layer corresponding to the channel region is formed as deeply as possible along a depth direction within a range where this N⁻type layer is not in contact with an underlying $SiO_2$ insulating layer of the thin-film semiconductor substrate (island) made of the SOI substrate.

As a fourth solution method, a P⁺type layer is provided which is electrically connected to a P⁻type substrate corresponding to the channel region, under the island.

As a fifth solution method, a P±type layer electrically connected to a channel region is provided on a surface portion at a channel region between a source region and a drain region. Furthermore, a thickness of the $SiO_2$ on an upper portion of this P±type layer is made thick.

As a sixth solution method, an MOS channel electrode electrically connected to the source region is provided on the surface portion at the channel region between the source region and the drain region.

As a seventh solution method, a PN junction (generally speaking, referred to a "PIN diode", or an "APD") having a sensitivity of light/radiation is formed on a first semiconductor substrate, and first to sixth JFETs are fabricated in a thin-film semiconductor substrate on this first semiconductor substrate.

The following effects are achieved by employing the first solution means. That is, the channel region in the Si layer of SOI may be formed without utilizing the epitaxial growth, so that density and the film thickness can be freely controlled. Since the respective islands are completely separated from each other by a dielectric substance, a plurality of JFETs may be fabricated on the same substrate, or these JFETs may be combined with a CMOS integrated circuit. Also, a plurality of PN junctions which have been completely electrically separated from each other are connected in a series form, so that a photovoltaic element capable of emitting a high voltage can be realized. A photovoltaic element could be conventionally realized by way of the dielectric separated substrate. In addition, a MOS transistor may be manufactured on the same semiconductor substrate. Both a photovoltaic element for an SSR (solid-state relay) and a MOS transistor for a driver element may be constructed in a one chip. Furthermore, a discharging JFET may be built in this one chip device.

As a result of the second solution means, the following effects can be obtained. That is, the channel length "Lg" between the source and the drain of the JFET can be manufactured under better control characteristics in resolution on the order of 1.0 to 0.2 micrometers in the photolithography, for example, with employment of the stepper, according to current semiconductor wafer manufacturing process technology. Thus, the resultant JFET with better high frequency characteristics can be obtained.

Further, there is such an advantage achieved by the third solution means. That is, since the width of the N⁻layer is used as large as the width of the Si layer of SOI, the ON resistance of the JFET can be lowered.

The following effects can be achieved by employing the fourth solution means. That is, since the depletion layer which has extended also to the P⁻gate region under the N⁻layer, does not substantially extend to the P⁺layer, and most of the electric fields produced by the gate electrode can be used as the gate region, an increasing ratio of the drain current to the gate voltage can be achieved, namely a voltage-to-current amplification ratio (will be referred to "gm") can be improved.

Since a fifth solution means is employed, the below-mentioned effects may be obtained. That is, as the P⁺type gate region is provided also above the gate region, namely one-sided gate electrode holds a half of the channel region, the essential channel thickness Tg becomes a half of the original channel thickness, so that the voltage-to-current amplification factor "gm" becomes effectively two times higher than the original amplification factor. In this case, since the channel length "Lg" is not changed, there is no problem in lowering of the withstanding voltage.

The following effects may be obtained by employing the sixth solution means. That is, since the surface portion of the channel region between the source region and the drain region is partially and continuously depleted independent of to the gate voltage, the channel current will flow through a portion slightly deeper from the surface portion. As a consequence, the resultant JFET cannot be readily, adversely influenced by boundary conditions, surface conditions, and external fields. It is also possible to greatly improve, for instance, protective reliability with respect to radiation by stabilizing the boundary surfaces in the above-described manner.

Since the seventh solution means is employed, the below-mentioned effects may be achieved. That is, when the PIN diode for detecting light/radiation and the JFET functioning as such a circuit element for firstly processing the signal outputted from this PIN diode are fabricated on the same substrate, these elements can be, first of all, made in an integrated circuit. It is very useful for such an element having the two-dimensional position resolution (will be referred to a "sensor") that the prestaged JFET can be constructed very close to the sensing portion. In other words, in most of such sensors, the single detecting elements (will be referred to "pixels") have been arranged in pitches from several tens of micrometers to several micrometers so as to achieve sufficient two-dimensional resolution, and thus, several hundred thousand of pixels are arranged within a region in a square of several centimeters. After the signal lines are extruded from these many pixels to the external sensor, each of these signal lines should be connected to the corresponding JFETs functioning as the prestage of the detecting circuit, resulting in a very cumbersome arrangement. At the same time, the strength of the detection signal derived from a single pixel is very weak, and is very easily influenced by external noises and the signal paths. Under such circumstances, it is desirable to input the detection signal into the prestaged JFET as quickly as possible for impedance conversion purposes. However, according to this seventh solution means of the present invention, since the impedance conversion is immediately performed very close to the pixels, positioning of the signal lines after the prestage circuit can be readily executed.

BRIEF DESCRIPTION OF THE DRAWINGS

For a better understanding of the present invention, reference is made of the following detailed description to be read in conjunction with the accompanying drawings, in which.

DETAILED DESCRIPTION OF PREFERRED EMBODIMENTS

Figure 1:
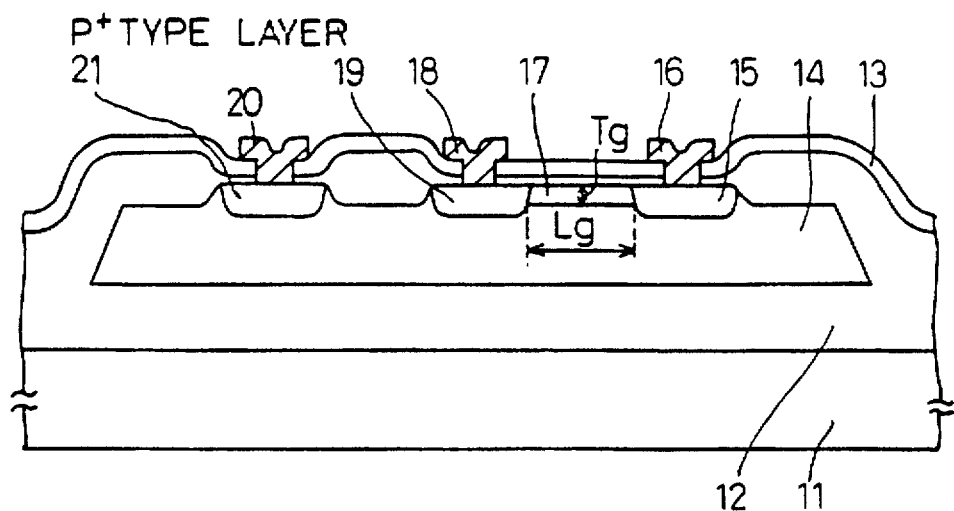
FIG. 1 schematically shows a sectional view of a JFET according to a first preferred embodiment of the present invention.

Referring now to the drawings, a description will be made of various preferred embodiment of the present invention.

FIG. 1 schematically shows a sectional view of a JFET (junction field-effect transistor) of a semiconductor integrated circuit according to a first preferred embodiment of the present invention. As a supporting substrate, either an insulating material, or a semiconductor device may be employed. In case of a semiconductor, there is no restriction as to the thickness thereof and the impurity type thereof. For instance, the insulating layer 12 made of $SiO_2$ having a thickness of 1 micrometer is provided on a semiconductor substrate 11 made of N type Si with 6 ohm centimeter, having a thickness of 500 micrometers. A P⁻type Si layer 14 (will also be referred to an "Si layer" of SOI hereinafter) is formed on this insulating layer 12, the thickness of which is selected to be on the order of 1 micrometer, and the resistivity of which is 10 ohm centimeter. The SOI substrate is manufactured as follows. For instance, the above-described N⁻type Si substrate having the resistivity of 6 ohm cm and the thickness of 500 micrometers is thermally treated to form $SiO_2$ having a thickness of 1 micrometer. The N⁻type Si substrate with the thickness of 500 micrometers is laminated with the P⁻type Si having the resistivity of 10 ohm cm. The resultant substrate is thermally treated at the temperature of 750° C. for 2 hours in the atmosphere of $N_2$. Thereafter, the resulting P⁻type substrate is ground until the thickness of the ground substrate becomes on the order of 1 micrometer, and polished in a mirror surface condition to finally obtain such an SOI substrate. It is important that the semiconductor layer 14 is formed on the insulating material 12. Assuming now that a portion of the semiconductor layer on which a single JFET has been fabricated is called as an "island", the respective islands must be electrically and completely separated from each other. In the semiconductor integrated circuit device of FIG. 1, it is apparent that these islands (JFETs) are perfectly separated from each other by way of a LOCOS oxidation film 13. The term "LOCOS" is the abbreviation of Local Oxidation. The LOCOS treatment is well known as the element separating method employed in the CMOS type semiconductor integrated circuit device. A typical thickness of $SiO_2$ is selected to be on the order of 1 micrometer. A self-alignment is realized with the formation of the source/drain region, and this LOCOS treatment owns the specific features in the manufacturing steps. However, since this LOCOS treatment is well known in the semiconductor manufacturing method, no further detailed description thereof is made.

Although various types of manufacturing methods may be conceived, in this preferred embodiment, the following manufacturing method is employed that the Si substrate is first etched until the thickness thereof becomes approximately 0.8 micrometers, and thereafter the LOCOS oxidation is carried out until this LOCOS oxidation could reach the underlying $SiO_2$ insulating layer so as to electrically separate the respective JFETs. A source region 19 made of an N⁺type layer whose impurity concentration is selected from $1E^{19}$ to $1E^{21}$ is positioned opposite to an N⁺type drain region 15 via an N⁻type layer 17 corresponding to an N type gate region whose impurity concentration is selected to be from $1E^{14}$ to $1E^{18}$. Both a source electrode 18 and a drain electrode 16 are provided on the respective regions. It should be noted that a gate length "Lg" may be defined by a drawing dimension when the source region 19 and the drain region 15 are formed by ion implantation, and generally speaking, this gate length may be determined by way of resolution of photoresist employed in the photolithography in view of the manufacturing method. Alternatively, the gate lengths from 1.0 micrometer to 0.25 micrometers may be arbitrarily selected by utilizing the very recent semiconductor stepper technology. In this embodiment, it is now assumed that the JFET having the gate length "Lg" of 0.6 micrometers is fabricated by using the i-ray semiconductor stepper. A thickness, or depth, of this channel region is selected to be equal to a depth "Tg" of the N⁻layer 17.

Figure 2A:
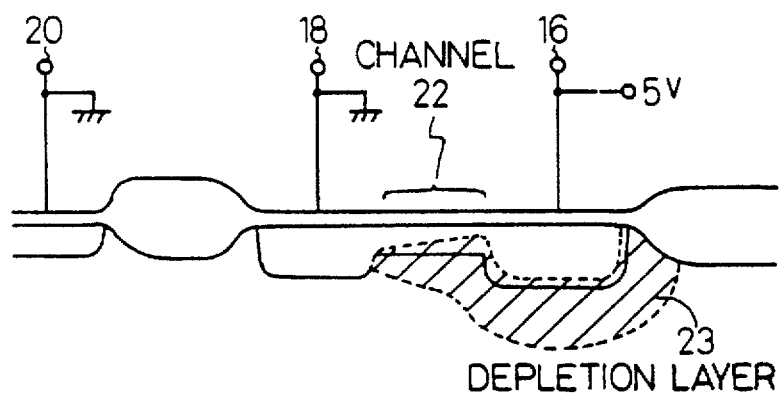
FIG. 2A schematically indicates a sectional views of the JFET according to the first preferred embodiment, which represents a condition of the depletion layer under conditions that a voltage of 5V is applied to the drain, and both the source and the gate electrode are grounded.
Figure 2B:
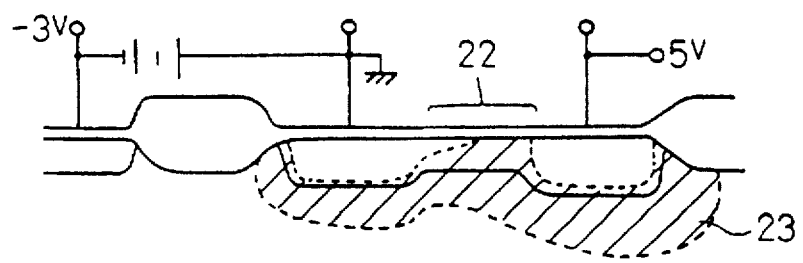
FIG. 2B schematically indicates a sectional view of this JFET which represents a condition of the depletion layer under conditions that a voltage of −3V is applied to the gate electrode, and other conditions are the same as above.
Figures 3A, 3B:
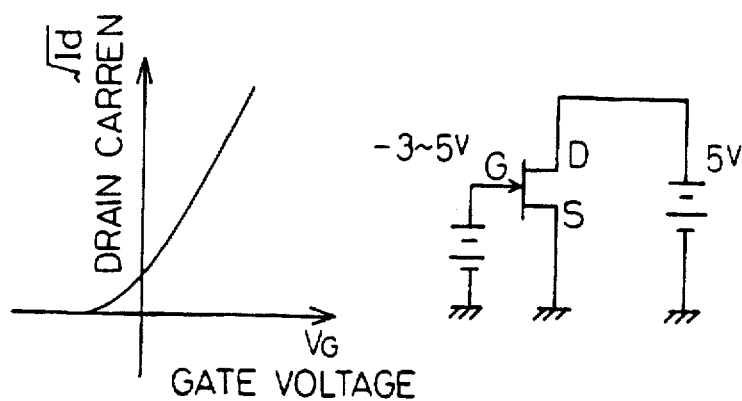
FIG. 3A is a graphic representation of the VG-ID characteristic of the JFET according to the first preferred embodiment of the present invention.
FIG. 3B is a circuit diagram used to measure the VG-ID characteristic thereof.

FIG. 2A schematically shows a sectional view for representing conditions of the depletion layer under such a state that a voltage of 5V is applied to the drain of the JFET, and both the source and the gate thereof are grounded (will be referred to a "GND"). FIG. 2B schematically indicates a sectional view for showing conditions of the depletion layer 23 under such a condition that a voltage of −3V is applied to the gate of the JFET and the remaining conditions of the source and the drain thereof are the same as FIG. 2A. As easily seen from FIG. 2B, the depletion layer 23 covers the gate region 22 in such a manner that a pinch off is performed, resulting in no channel current therethrough. FIG. 3A is a graphic representation for indicating a VD-ID characteristic of this JFET under the above-described conditions. As apparent from FIG. 3A, better characteristics of this JFET can be obtained, as compared with the conventional V-shaped groove type JFET. FIG. 3B is a schematic circuit block diagram used to simply measure the VG-ID characteristic of the JFET. In the conventional V-shaped groove type JFET, since there is no semiconductor manufacturing technique capable of controlling the two-dimensionally arranged gate length having a length of approximately 1.0 micrometer, the gate length "Lg" and the gate depth "Tg" each having the dimension of approximately 1.0 micrometer are manufactured by utilizing the anisotropic etching of Si with employment of KOH. However, the conventional JFET experiences fluctuations in the dimensions of the gate length and channel depth, and such an improper characteristic, resulting in lowering the yield. To the contrary, according to the present invention, the JFET with less fluctuation of its structural elements can be manufactured.

As previously described in this preferred embodiment, it is very useful to construct a discrete JFET with the above-described structure. In addition thereto, another major feature of the present invention is such that since the respective islands are electrically separated from each other, the signal processing circuit normally used after the JFETs can be fabricated on the same substrate. That is to say, there is such a feature that not only an analog processing circuit such as an operational amplifier, but also various signal/data processing circuits such as an A/D converter and a digital flip-flop can be readily integrated. These circuit arrangements may be constructed of a CMOS structure, or a BiCMOS structure. Since such an integrated circuit is most probably utilized in the radiation measuring field, SOI is employed to construct such a CMOS circuit, a BiCMOS circuit, or a JFET element, which can sustain adverse influences caused by radiation. Moreover, if the JFET according to the present invention would be built in an element for SSR (solid-state relay), then the resultant SSR element could be very useful in which the photovoltaic element functioning as the photoelectric converting element and the MOS transistor functioning as the driver circuit are manufactured in one body.

Figure 13:
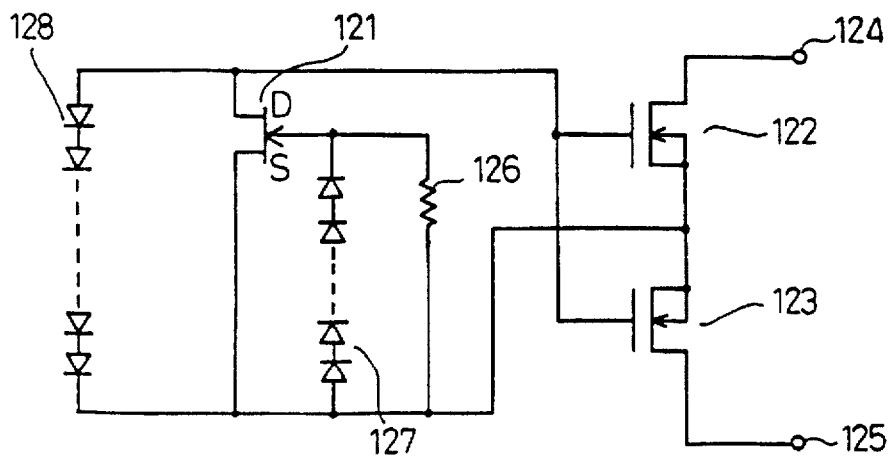
FIG. 13 is a schematic circuit diagram of a semiconductor integrated circuit device for an SSR (solid-state relay) according to the present invention.

FIG. 13 schematically shows a circuit block diagram for representing a semiconductor integrated circuit device used an SSR element, according to the present invention. Basically, this semiconductor integrated circuit device is operated in such a manner that a photodiode array 128 for receiving light corresponding to an input signal produces a voltage which will be applied to gates of N⁻channel MOS transistors 122 and 123, whereby terminals 124 and 125 are bidirectionally connected. There is a problem that since electron charges in the gates of the MOS transistors cannot be discharged after the incident light is turned OFF, these MOS transistors are still brought into the conducting state. Therefore, with employment of the circuit arrangement as shown in FIG. 13, since the photodiode array 127 biases the gate electrode of the JFET 121 to a minus potential while the light is incident upon the photodiode array 127, this JFET 121 is turned ON at a time instant when this incident light disappears, so that the output of the photodiode array 128 can be quickly discharged. A resistor 126 is connected in parallel to the photodiode array 127. With such a circuit arrangement, a single chip of an SSR element having very good ON/OFF characteristics can be realized. The above-described technical ideas of forming the circuit devices on the same substrate together with the signal processing circuit, or together with the SSR element, are very useful in conjunction with a JFET arranging method as will be discussed in the below-mentioned preferred embodiment. Merely the above-described technical ideas have been explained in connection with the first preferred embodiment.

Figure 4:
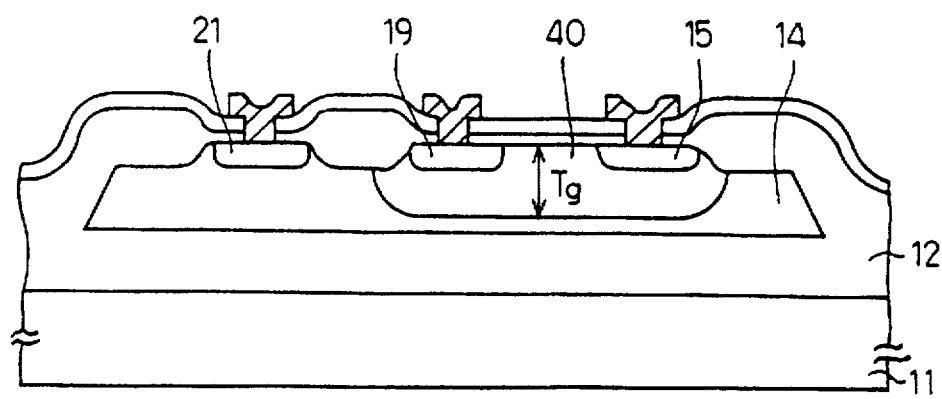
FIG. 4 schematically indicates a sectional view of another JFET according to a second preferred embodiment of the present invention.

FIG. 4 schematically represents a sectional view of a JFET of a semiconductor integrated circuit device according to a second preferred embodiment of the present invention. This JFET of the second embodiment is so fabricated that a deep region N⁻type layer 40 corresponding to the gate region of such a JFET as explained in the first preferred embodiment, is formed along the depth direction within a range where this N⁻type layer 40 is not in contact with the underlying SiO₂ insulating layer. As shown in this drawing, the N⁻layer 40 is formed on the surface of P⁻Si layer, and thus formed deeper than the source region 19 and the drain region 15. With such a structural arrangement, the thickness of the gate region "Tg" can be made very thick, namely an allowable thickness determined by the original thickness of the Si layer of SOI, so that the ON-resistance can be reduced.

Figure 5:
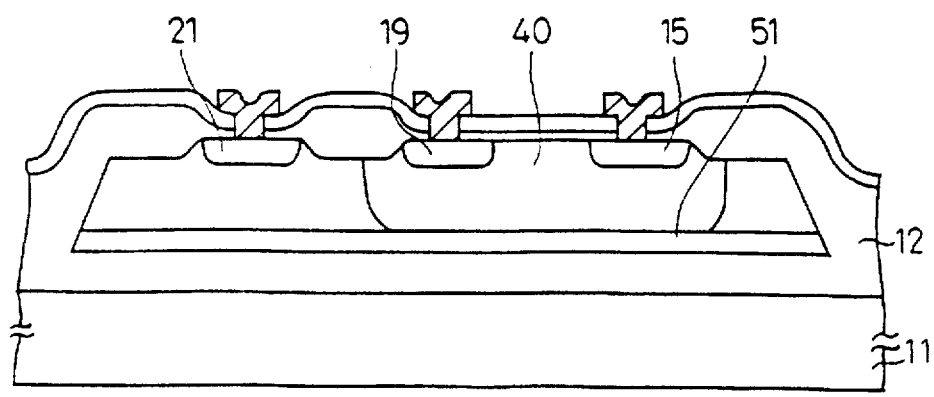
FIG. 5 schematically denotes a sectional view of another JFET according to a third preferred embodiment of the present invention.

FIG. 5 schematically shows a sectional view of a JFET of a semiconductor integrated circuit device according to a third preferred embodiment of the present invention. This JFET of the second preferred embodiment is fabricated so that an embedded P⁺type layer 51 corresponding to a P type impurity region with high density which will become a second gate region, is previously formed under the Si layer of SOI in addition to the above-described manufacturing method. That is, the N⁻type layer 40 corresponding to the gate region of the JFET is formed along the depth direction as deeply as possible within such a range where this N⁻type layer 40 is not in contact with the underlying SiO₂ insulating layer. The P⁺type layer 51 is previously fabricated when the semiconductor substrate of SOI is formed under dose amounts of about 1E15 to 5E15 atoms/cm² by way of the ion implantation of boron. In this case, when the ion implantation is carried out by ion seeds such as BF₂ and BF₃, diffusion along the upper direction is not advanced and therefore such a P⁺type layer having a better profile can be manufactured. With employment of the above-explained structure, the depletion layer which has extended to the side of P⁻gate region under the N⁻layer, is not substantially extended to the P⁻layer, and most of depletion layers caused by the electric field of the gate electrode may be used as the channel region. As a consequence, an increasing ratio of the gate voltage to the drain current, namely a voltage-to-current amplification factor (referred to as "gm") can be improved.

Figure 6:
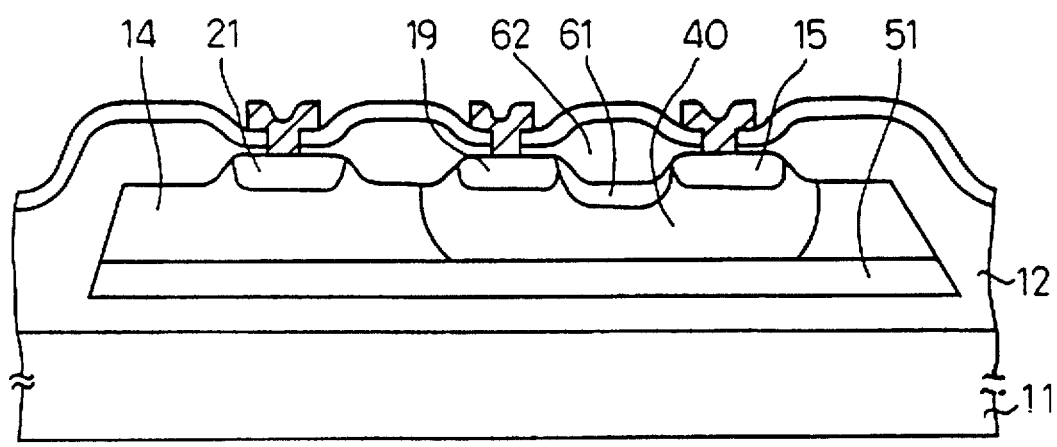
FIG. 6 schematically represents a sectional view of a further JFET according to a fourth preferred embodiment of the present invention.

FIG. 6 schematically indicates a sectional view of another JFET of a semiconductor integrated circuit device according to a fourth preferred embodiment of the present invention. In this fourth preferred embodiment, such a means is employed in addition to the structure of the third preferred embodiment, that the P±type layer 61 electrically connected to the surface portion of the gate region is provided in the channel region between the source region and the drain region. In this drawing, a further structure is shown that the oxidation film above this P±type layer 61 is formed as a LOCOS oxidation film 62.

FIGS. 7A to 7G, are sectional views for showing a manufacturing step to manufacture the JFET of the semiconductor device according to this preferred embodiment.

Figure 7A:
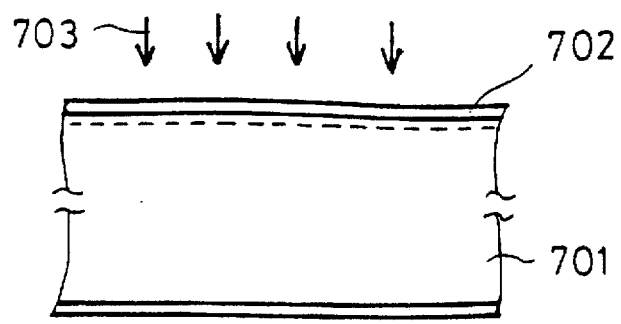
FIG. 7A to 7G are schematic sectional views for representing manufacturing steps of the JFET of the semiconductor device according to the fourth preferred embodiment of the present invention.
Figure 7B:
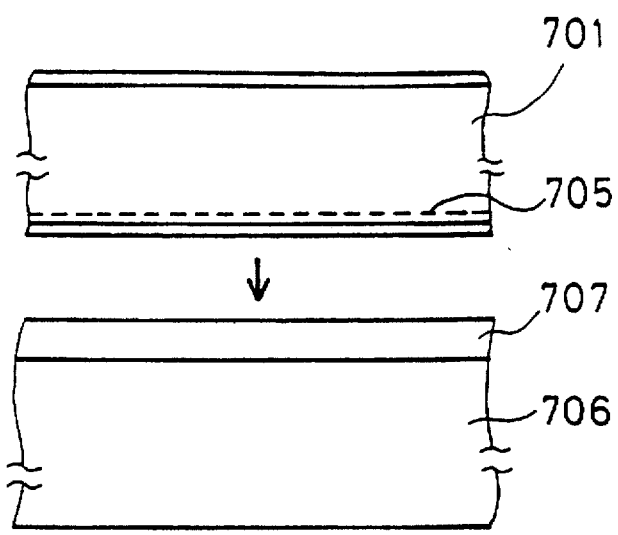
Figure 7C:
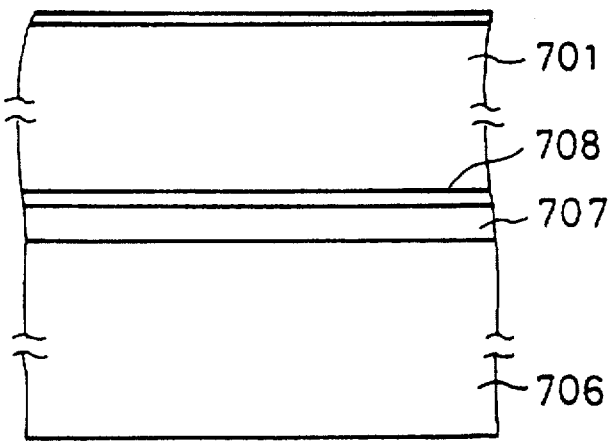
Figure 7D:
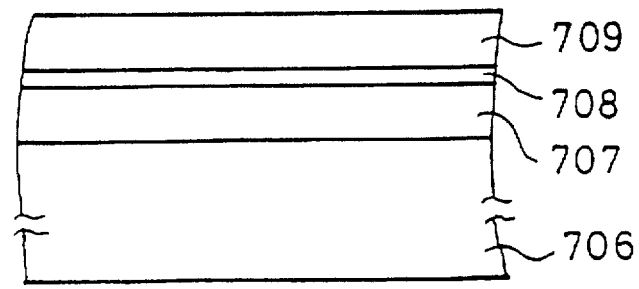
Figure 7E:
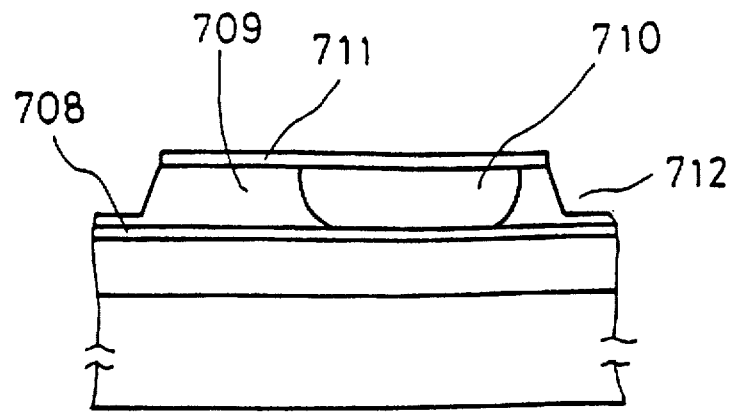

A P⁻type Si substrate 701 having resistivity of 10 ohm cm and a thickness of 500 micrometers, is thermally oxidized to form an oxidation film (SiO₂) 702 having a thickness of 200 angstroms. Subsequently, ion implantation 703 under dose amount of BF₂80KeV5E15/cm² is carried out (see FIG. 7A). Next, Si substrate 701 is brought in contact with an N⁻type Si substrate 706 (resistivity of 6 ohm cm and thickness of 500 micrometers) in such a manner that a BF₃ ion implanted layer 705 is in contact with this N⁻type Si substrate having the SiO₂ film 707 with the thickness of 1 micrometer (see FIG. 7B). Thereafter, the resultant substrate is processed by such a thermal process at the temperature of 750° C., in atmosphere of N₂, for two hours, thereby hardening an adhesive agent (see FIG. 7C). Since this thermal treatment is carried out under such a low temperature of 750° C., the diffusion depth of the P⁺type layer 708 fabricated by the BF₂ ion implantation and activated by the thermal treatment can be made as small as possible. Then, the P⁻type substrate 701 is ground in a mirror surface, so that a P⁻type Si layer 709 having a thickness of 2 micrometers is obtained (see FIG. 7D). Next, ion implantation by a dose amount of phosphorus 2E13/cm² is performed, and a thermal treatment at a temperature of 1000° C. in an atmosphere of O₂ is performed for 1 hour, so that an N⁻type layer 710 is fabricated. Subsequently, to separate the islands, the Si surface is partially etched away by about 1.8 micrometers 712. SiO₂711 is formed when the N type layer is thermally treated. Thus, the resultant substrate becomes as shown in FIG. 7E.

Figure 7F:
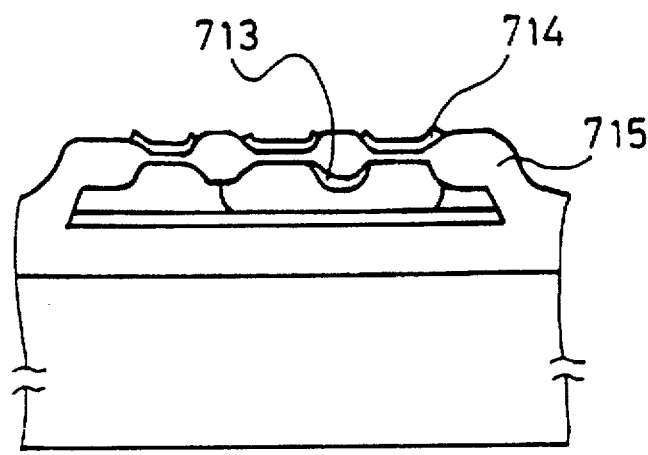
Figure 7G:
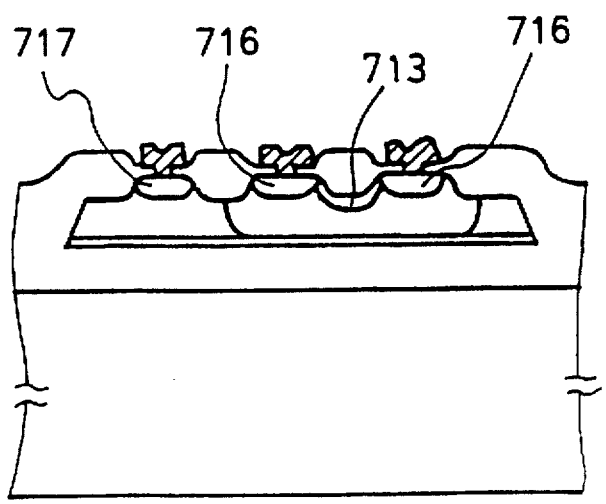

Thereafter, a P±type layer 713 is formed by ion-implanting born at a dose amount of 7E13/cm², and then a LOCOS oxidation film 715 having a thickness of 8000 angstroms is fabricated in an atmosphere of O₂ at a temperature of 1000° C. for 8 hours approximately so that the islands are completely and electrically separated from each other (see FIG. 7F). At the same time, this P⁺type layer 713 is self-aligned with the LOCOS oxidation film 715. An SiN film 714 is a mask SiN during the LOCOS oxidation. Subsequently, N⁺type regions 716 are formed by ion-implanting phosphorus at a dose amount of 3E15/cm², and a P⁺type region 717 is fabricated by ion-implanting boron at a dose amount of 5E15/cm², so that the JFET shown in FIG. 7G is obtained.

Figure 8A:
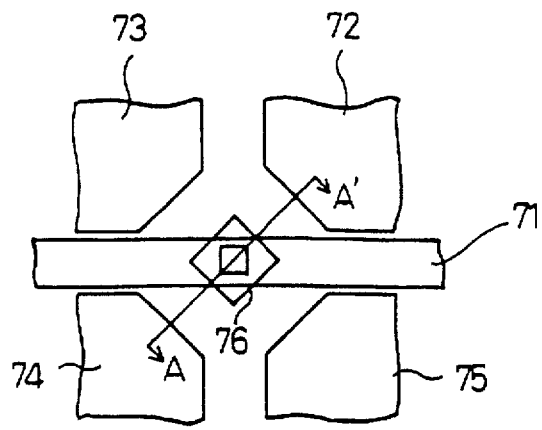
FIG. 8A schematically indicates a plan view of the JFET according to the fourth embodiment of the present invention, and FIG. 8B schematically shows a sectional view of the fourth JFET, taken along a line A to A'.
Figure 8B:
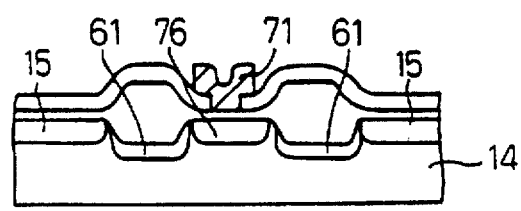

FIG. 8A is a plan view of the JFET of the semiconductor device according to this preferred embodiment. It should be noted that a P±type layer implies impurity concentration higher than the P⁻type impurity concentration, and P type impurity concentration lower than the P⁺type impurity concentration. In this embodiment, P±type impurity concentration is expressed by such a relationship of impurity concentration: P⁺type>P±type>P⁻type. FIG. 8B schematically shows a section JFET of FIG. 8A, taken along a line A-A' of FIG. 8A, and represents such a condition that the gate electrode 71 is connected by the P⁺type layer 76. A P⁺type layer 76 functioning as a second gate region is electrically connected to the P±type layer 61. With employment of such a structure, since the P⁺type gate region may be provided above the channel region, namely the channel region for accepting one-sided gate electrode becomes a half thereof, the channel thickness "Tg" essentially becomes a half thereof. As a consequence, two times "gm" can be effectively obtained. In this case, since the channel length "Lg" does not change its length, there is no problem in voltage withstanding characteristics. The resultant JFET is practically very useful.

Figure 9:
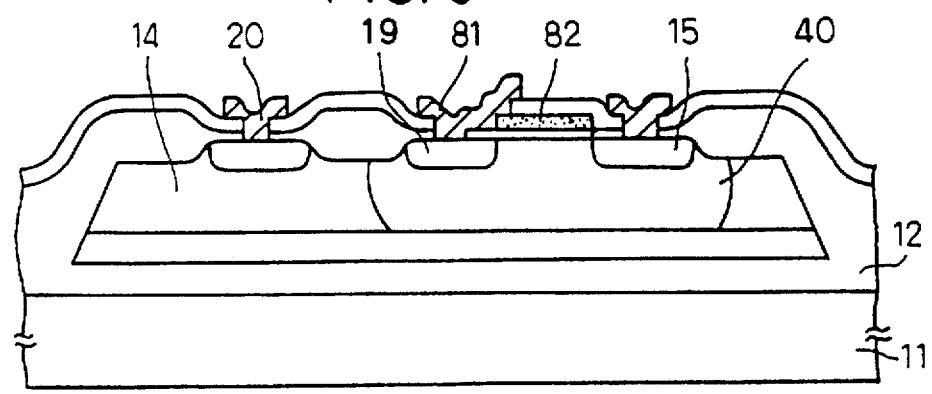
FIG. 9 schematically shows a sectional view of a JFET according to a fifth preferred embodiment of the present invention.
Figure 10:
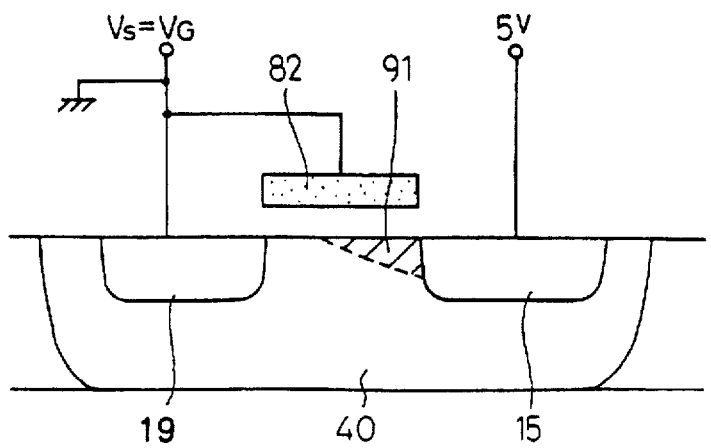
FIG. 10 schematically indicates an enlarged sectional view of a MOS gate electrode portion of the JFET according to the fifth preferred embodiment of the present invention.

FIG. 9 schematically shows a sectional view of another JFET of a semiconductor integrated circuit device according to a fifth preferred embodiment of the present invention. This JFET is constructed in such a manner that a MOS gate electrode 82 electrically connected by a source electrode 81 to a source region 19 is provided on a surface region at a gate region between the source region 19 and the drain region 15. FIG. 10 is an enlarged view of the MOS gate electrode portion. Since the surface portion at the gate region between the source region 19 and the drain region 15 is continuously and partially depleted independently of the gate voltage VG, the gate current will continuously flow through a portion slightly deeper than the surface portion. This surface portion of the JFET cannot be easily, adversely influenced by the boundary conditions, the surface conditions, and the external fields. Also, since the boundary conditions are brought into stable conditions, high reliability with respect to radiation effects can be obtained.

Figure 11:
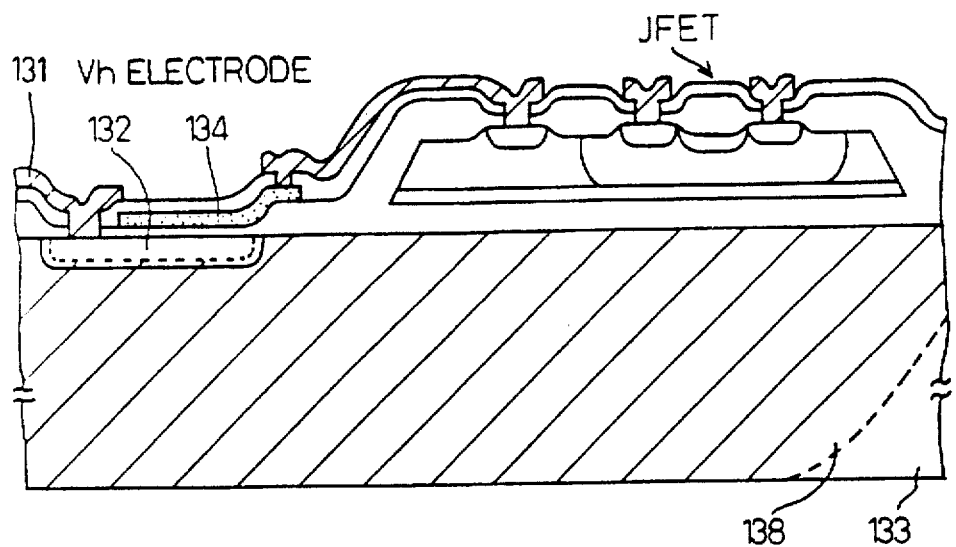
FIG. 11 is a schematic diagram for showing a semiconductor integrated circuit device according to a sixth preferred embodiment of the present invention.
Figure 12:
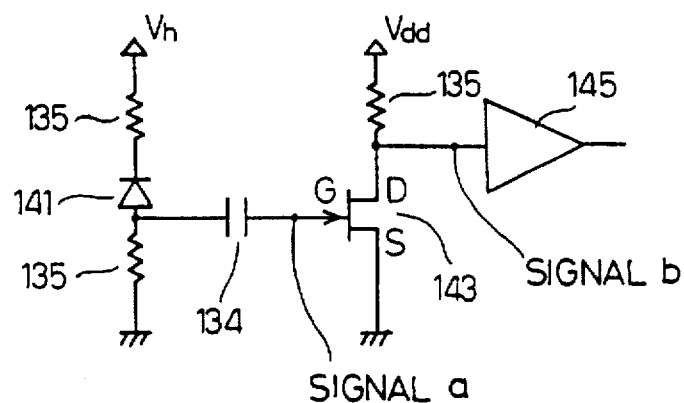
FIG. 12 schematically shows a circuit diagram of a semiconductor integrated circuit device constructed of a PIN diode and a general-purpose signal processing circuit.

FIG. 11 schematically shows a sectional view of a JFET of a semiconductor integrated circuit device according to a sixth preferred embodiment of the present invention. In accordance with this sixth preferred embodiment, a PN junction capable of sensing light and radiation (generally, referred to a "PIN" diode or an "APD") is formed by manufacturing a P⁻type layer 132 on a first semiconductor substrate N⁻type layer 133, and the JFET as previously described in connection with the previous embodiments is fabricated on the Si layer of SOI on the same semiconductor substrate. FIG. 12 is a schematic block diagram for showing a general-purpose signal processing circuit arranged by the PIN diode 141 corresponding to the integrated circuit shown in FIG. 11, resistors 135, a capacitor 134, the JFET 143, and an operational amplifier 145. In other words, since both of the PIN diode 141 for detecting the light and radiation, functioning as a photoelectric converting element, and the JFET 143 functioning as a circuit element for firstly processing the detection signal from the PIN diode 141 are fabricated on the same substrate, these circuit elements can be integrated. For instance, in such an element having two-dimensional positional resolution, (will be referred to a "sensor"), the first-staged JFET can be positioned very close to the light/radiation detecting portion.

In other words, in such a sensor, a large number of unit detecting elements (will be referred to a "pixel") are arranged in a pitch of several tens of micrometers to several micrometers so as to obtain a sufficient level of two-dimensional resolution. Within a rectangular region by a size of several centimeters, there are arranged several hundred thousand pixels. It is a very cumbersome workload that after the signal lines from the pixels are conducted outside the sensor, the corresponding JFETs functioning as the prestage of the detecting circuit should be connected to each of these signal lines. Moreover, since the level of the signal derived from a single pixel is extremely low, such a low-level signal is subject to external noise as well as adverse influences caused by routing of the signal lines. Under such a circumstance, the low-level signals must be supplied to the respective JFETs so as to be impedance-converted. In accordance with the sixth preferred embodiment, since the impedance conversion is carried out immediately after the pixels, easy routing of the signal lines after the impedance conversion can be achieved.

Figure 14A:
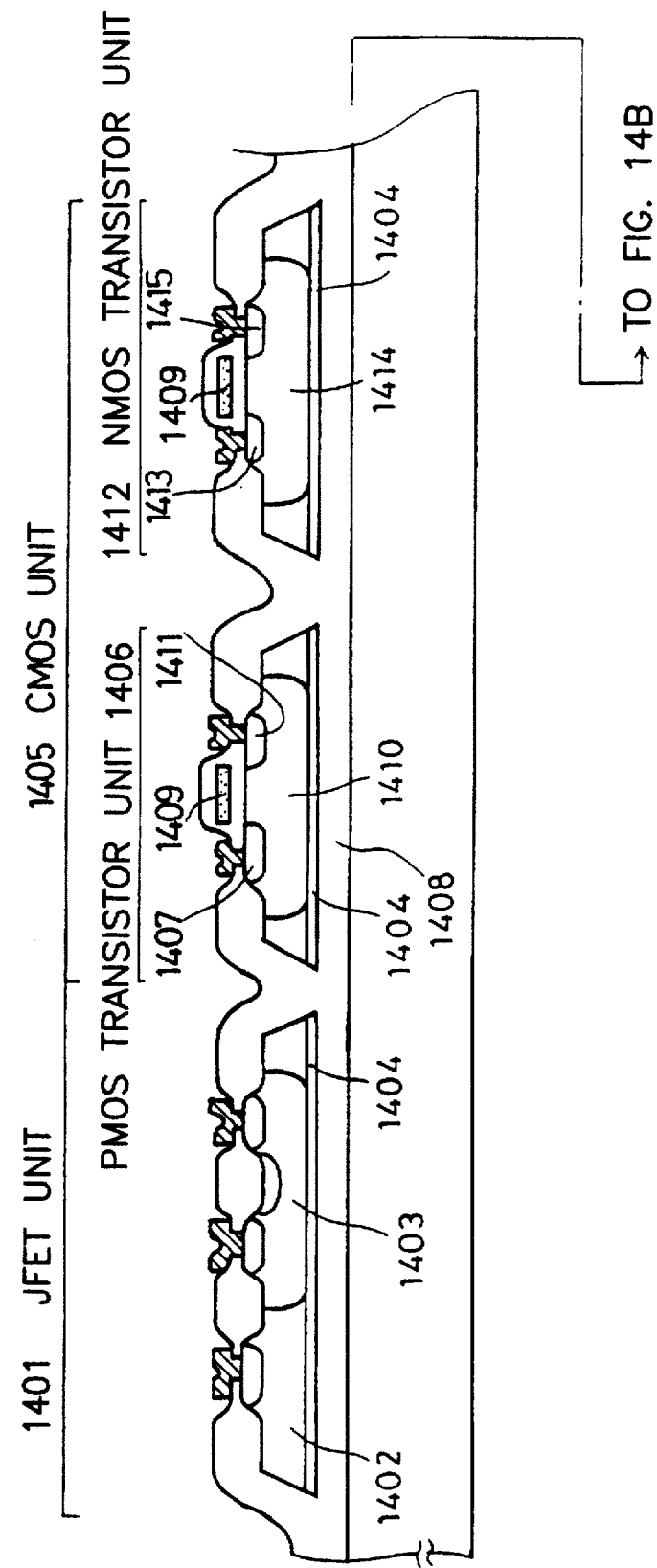
FIG. 14 schematically shows a sectional view of a semiconductor integrated circuit device according to a seventh preferred embodiment of the present invention.
Figure 14B:
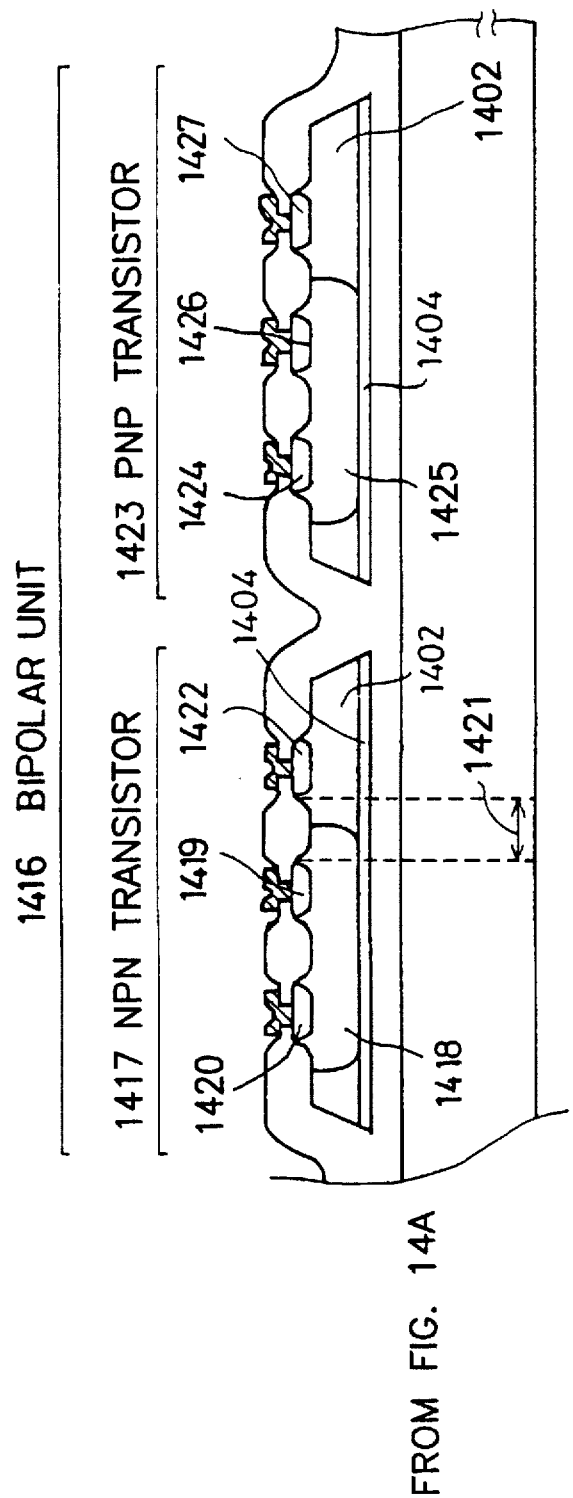

FIG. 14 schematically indicates a sectional view of a semiconductor integrated circuit device according to a seventh preferred embodiment of the present invention. This semiconductor integrated circuit device is constructed of a JFET unit 1401, a CMOS unit 1405, and a bipolar unit 146. The JFET unit 1401 is such a JFET, as previously described in the fourth preferred embodiment, having the N⁻type layer 1403, the P⁺type layer 1404 and the P⁻type substrate 1402. The JFET unit 1401, the CMOS unit 1405, and the bipolar unit 1416 are electrically separated from each other on a common substrate. It should be understood that the circuit wiring lines are formed by way of, for instance, Al wiring lines. For the sake of simplicity, the wiring lines are omitted from this sectional view.

On the other hand, the CMOS unit 1405 is composed of a P-channel type MOS (MIS) transistor, a PMOS transistor such as unit 1406, and an NMOS transistor unit 1412 and the like (of course, resistors and capacitive elements are employed, if necessary). The PMOS transistor unit 1406 is constructed of a P⁺type layer 1404 as similar to the JFET unit 1401, in addition to a gate electrode 1409, a P⁺type source region 1407, a P⁺type drain region 1411 and a P⁺type layer (N⁻type well) 1410 corresponding to the substrate (i.e., body or substrate represented in MOS). The concentration of this N⁻type layer 1410 may be made equal to, or may be different from that of the N⁻type layer employed in the JFET unit 1401 in the manufacturing step. For instance, a dose amount for the PMOS transistor unit 1406 is preferably selected to be approximately the phosphorous dose mount of 5E12, and the concentration thereof is selected to be lower than that for the JFET unit 1401. Since the P⁺type layer 1404 is provided under the N⁻type layer, the generation current and the like can be prevented which are produced under boundary condition between this P⁺type layer 1404 and the buried SiO₂ layer 1408 of the N⁻type layer. This P⁺type layer 1404 is manufactured by employing the manufacturing steps as described in the fourth preferred embodiment, and may be manufactured in a simple manner.

The above-described semiconductor integrated circuit device is fabricated by combining the JFET unit and the CMOS unit with the bipolar transistor unit, namely in accordance with the manufacturing steps as described in the fourth preferred embodiment in addition to the manufacturing steps for the CMOS unit and the bipolar transistor unit. An NMOS transistor unit 1412 is arranged by a gate electrode 1409, an N⁺type source region 1413, an N⁺type drain region 1415, a P⁻type layer (P⁻type well) 1414, a P⁺type layer 1404 and the like. As this P type layer (P⁻type well), the P⁻type substrate 1402 may be employed without any modification. Otherwise, assuming now that the resistivity of this P⁻type substrate is on the order of 15 ohm cm, such a substrate may be preferably manufactured by implanting boron therein at a dose amount of approximately 5E12. Also in this case, the P⁺type layer 1404 provided under the P⁻type well can prevent the generation of such an unnecessary generation current, and simultaneously can prevent a so-called "back gate current" that is the specific problem to the SOI transistor in the NMOS transistor unit 1412. Since such a CMOS structure is a latch-up free condition, and also there is no floating of defects from the depth portion of the substrate, this CMOS structure can highly sustain radiation and can provide a superior characteristic.

Then, the bipolar transistor unit 1416 is composed of an NPN transistor (lateral type transistor) 1417, a PNP transistor (vertical type transistor) 1423, and other circuit elements (fabricated by a PN diode and a Schottky diode). This NPN transistor 1417 is constructed of a P⁻type layer 1418 for a base region thereof, a P⁺type base electrode deriving region 1419, an N⁺type emitter region 1420, and an N⁺type collector region 1422. The P⁻type base region, 1418 is fabricated under concentration of a boron dose amount of approximately 1E13. In this seventh preferred embodiment, since the substrate 1402 is of P⁻type, the NPN transistor becomes a lateral type transistor, the base width of which is determined by a LOCOS width defined between the emitter and the collector thereof, as represented by reference numeral 1421 of FIG. 14. The P⁺type layer 1404 can similarly prevent the production of such an unnecessary current at the lower boundary surface. On the other hand, the PNP transistor 1423 is arranged by an N⁻type base region 1425, a P⁺type emitter region 1424, an N⁺type base-electrode deriving region 1426, a P⁻type substrate 1402 functioning as a collector, a P⁺type collector-electrode deriving region 1427, and the like. The N⁻type base may be manufactured in a similar manner to that of the JFET unit and the PMOS transistor unit. Preferably, this N⁻type base is formed under a phosphorous dose amount of 1E13. The P⁺type layer 1404 can similarly prevent the generation of the unnecessary current at the boundary surface, and at the same time, can function as an N⁺type buried collector, thereby contributing an improvement in the current drivability of the PNP transistor and reducing $V_{CESAT}$. In case of this preferred embodiment, since the substrate 1402 is of P⁻type, a vertical type PNP transistor is available. Even when this vertical type PNP transistor would be integrated with such a CMOS device, it is possible to realize such a PNP transistor having a high beta value.

Figure 15:
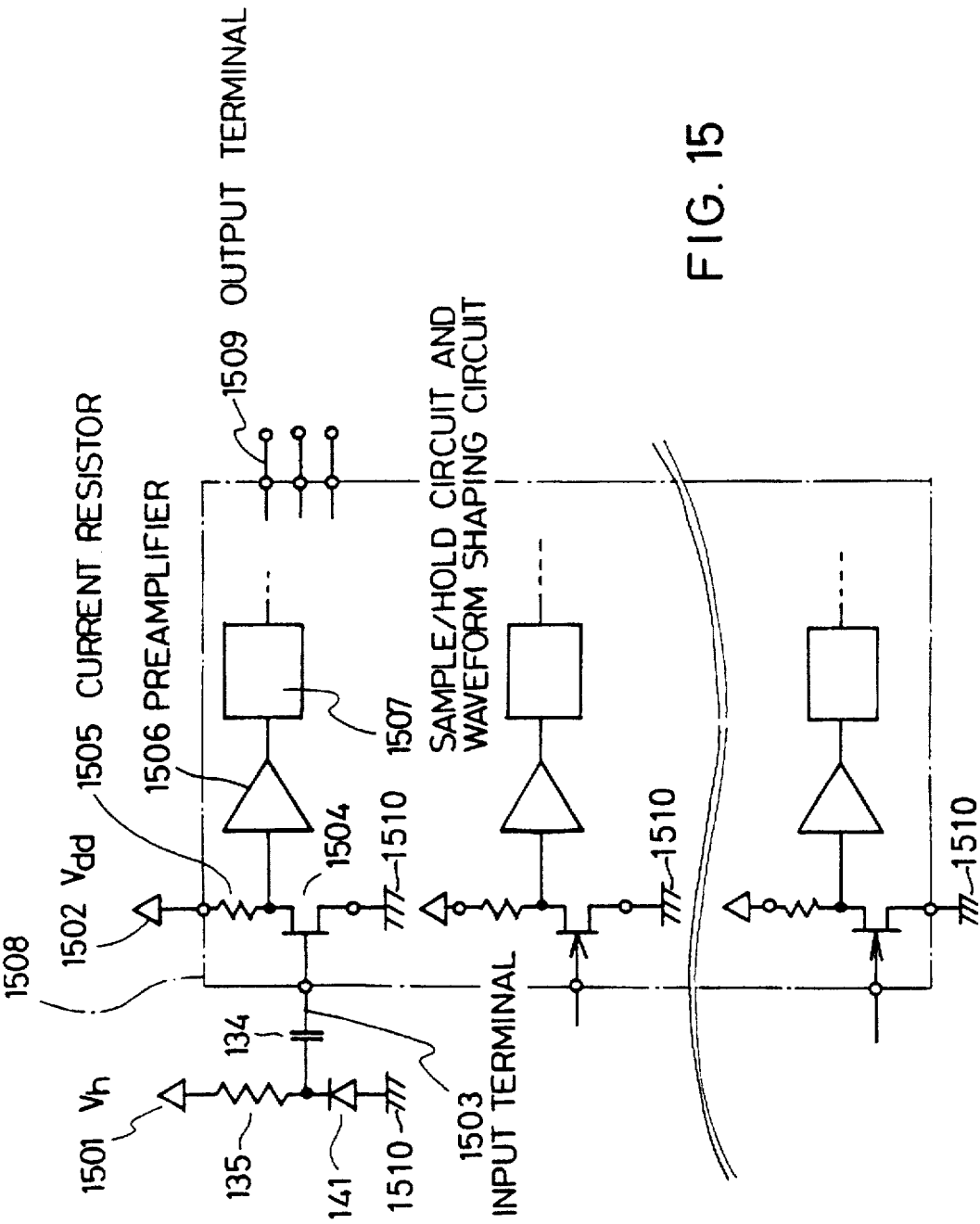
FIG. 15 is a schematic block diagram for showing a circuit of the semiconductor integrated circuit device according to the seventh preferred embodiment of the present invention.
Figure 16A:
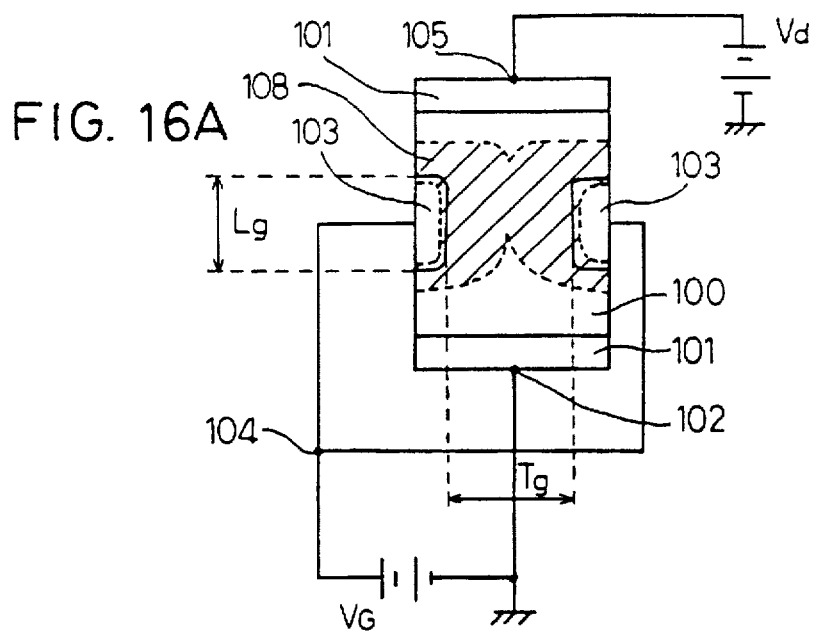
FIG. 16A schematically indicates a sectional view for showing the basic idea of the conventional N⁻gate type JFET.
Figure 16B:
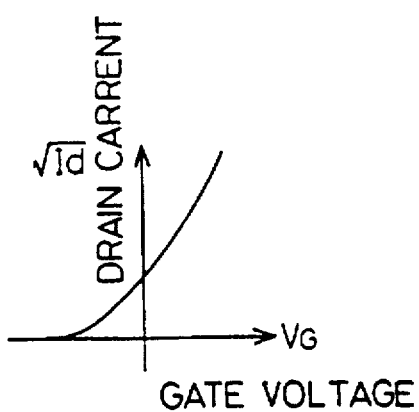
FIG. 16B is a graphic representation for indicating the electric characteristic of the conventional normally-ON type (depletion type) JFET.
Figure 16C:
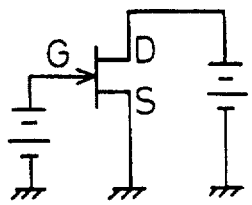
FIG. 16 C denotes a symbolic diagram of the JFET.
Figure 17:
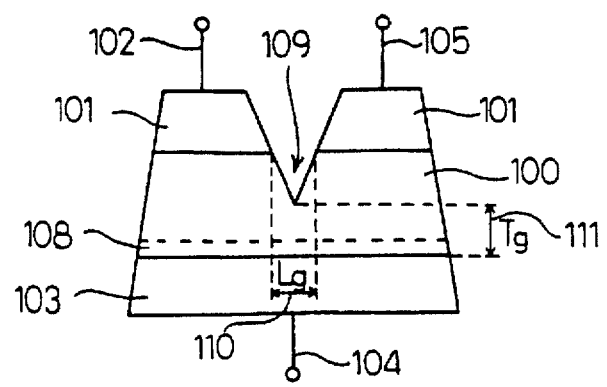
FIG. 17 schematically shows a sectional view of the conventional V-shaped groove type JFET which is practically available.
Figure 18:
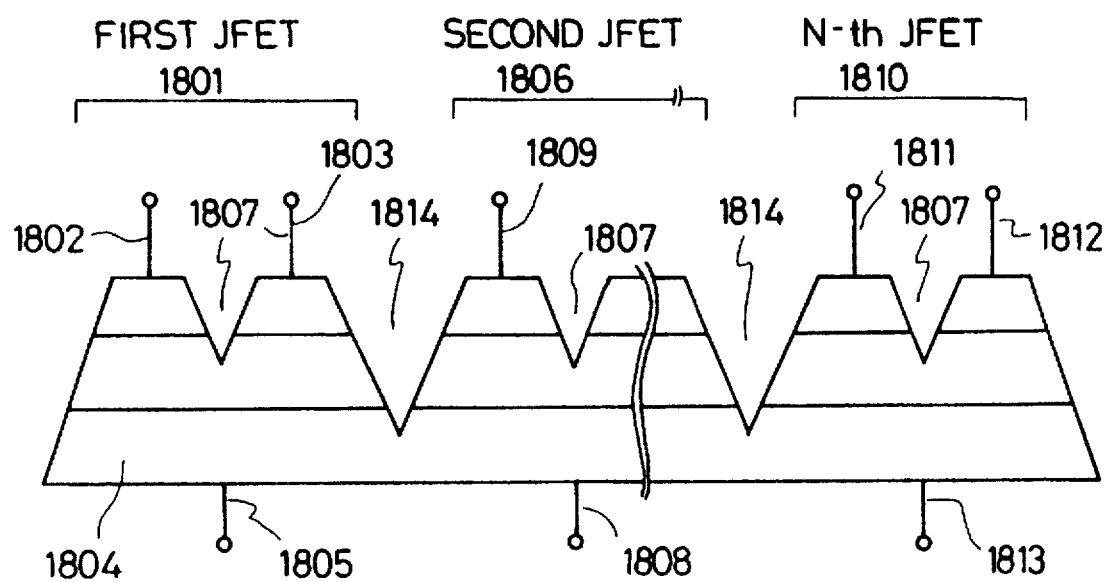
FIG. 18 schematically represents a sectional view illustrating difficulties when multiple elements are fabricated on the same semiconductor substrate in the conventional JFET.

FIG. 15 is a schematic block diagram for representing a circuit diagram of a multi-input type semiconductor integrated circuit device 1508 according to a seventh preferred embodiment of the present invention. In this semiconductor integrated circuit device, a plurality of JFET units 1504 are arranged, and are electrically separated from each other on the substrate by way of the islands. Each JFET unit 1504 is connected via a current resistor 1505 to, for instance, a voltage source Vdd 1502 of 5V, whereas a gate electrode thereof is connected to a detecting element provided outside the multi-input semiconductor integrated circuit device 1508 according to this seventh preferred embodiment. In this case, there is shown a typical light/radiation detecting element. Reference numeral 134 denotes a coupling capacitance, reference numeral 141 indicates a photodiode such as a PIN diode for detecting light and radiation, and reference numeral 135 is a bias resistor. Normally, high voltages from several tens to several hundreds volts are applied to Vh1501. A signal derived from the JFET unit 1504 is supplied to an output terminal 1509 via a preamplifier 1506, and a circuit such as a sample/hold circuit and a waveform shaping circuit 1507. Various types of output signals may be produced by way of multiplexing the analog data, and A/D-converting the detection signal into the digital detection signal, with employment of the proper circuit arrangement. When all of the circuit elements other than the JFET would be assembled in the CMOS structure, the substantial workloads about the circuit design and the manufacturing steps may be omitted. If a high-frequency signal higher than 100 MHz should be handled in this semiconductor integrated circuit, then such a circuit arrangement of the JFET unit, the CMOS unit, and the bipolar transistor unit, which has been previously explained, could be utilized. If power consumption of this multi-input type semiconductor integrated circuit device is not taken into account, then a circuit arrangement made by combining the JFET unit and the bipolar transistor unit may be employed. In FIG. 15, reference numeral 1510 indicates a ground (GND) terminal.

Here, a major feature of the present invention is that a plurality of JFET units independently provided and a signal processing circuit coupled thereto (alternatively, a plurality of signal processing circuits coupled to the corresponding JFET units) can be combined on the same substrate (monolithic substrate). As previously explained, a JFET is necessarily required as the prestaged transimpedance element in the radiation measuring field. In other words, since a high input impedance is required, a bipolar transistor cannot be employed. Moreover, since a gate electrode of a MOS transistor is charged up, this MOS transistor cannot be utilized either. As a consequence, only such a JFET (Junction Field-Effect Transistor) must be available. Under such circumstances, there are great merits in the radiation measuring semiconductor integrated circuit, since a multi-input/multi-gate signal processing circuit could be manufactured in a monolithic integrated circuit by employing JFETs.

As previously described in detail, in accordance with the present invention, it is possible to realize a junction type field-effect semiconductor device having an improved high frequency characteristic, a low ON-resistance, and a high voltage-to-current amplification factor. Since this JFET device may be integrated together with a photoelectric converting element, a MOS type FET, or a bipolar transistor, a very high speed sensor integrated circuit could be realized.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A junction type field effect transistor comprising:
   a substrate;
   a first conductivity type semiconductor film forming a first gate region located above said substrate, said semiconductor film having a bottom surface which faces said substrate, a top surface which faces away from said substrate and a side edge;
   a layer of insulating material which is disposed between said substrate and said semiconductor film and covers said bottom surface and said side edge of said semiconductor film, said layer of insulating material electrically isolating said semiconductor film from said substrate;
   a second conductivity type source region and drain region formed at the top surface of said semiconductor film, each region having a bottom which faces, and is spaced from, said bottom surface of said semiconductor film;
   a second conductivity type gate region formed in said semiconductor film and extending continuously at least between the source region and the drain region, said gate region having an impurity concentration lower than said source region and drain region; and
   a first impurity region of a first conductivity type for connection to a gate electrode formed at said top surface of said semiconductor film and spaced apart from said source region and drain region, said first impurity region having an impurity concentration higher than said semiconductor film, wherein said channel gate region extends more deeply than the source region and the drain region and extends laterally to underlie both the source region and the drain region.

2. A JFET according to claim 1 further comprising a first conductivity type impurity layer formed in the bottom surface of said semiconductor film, said impurity layer having an impurity concentration higher than said semiconductor film.

3. A JFET according to claim 1 further comprising a second gate region of a first conductivity type formed on said gate region and at the top surface of said semiconductor film between the source region and the drain region, wherein the second gate region has an impurity concentration higher than the impurity concentration of said semiconductor film and lower than the impurity concentration of said first impurity region; and
   a second impurity region of a first conductivity type for connection to the gate electrode, said second impurity region having substantially the same impurity concentration as said first impurity region and being coupled to said second gate region.

4. A JFET according to claim 1 further comprising an insulating layer on said top surface of said semiconductor film; and a conductive layer on said insulating layer between said source region and said drain region, said conductive layer being electrically connected to at least one of said source region and drain region.

* * * * *